(12) United States Patent
Chin

(10) Patent No.: US 9,143,129 B2
(45) Date of Patent: Sep. 22, 2015

(54) LOW POWER, ACCURATE REFERENCE-FREE THRESHOLD DETECTOR

(75) Inventor: Jeffrey Chin, Singapore (SG)

(73) Assignee: Broadcom Corporation, Irvine, CA (US)

( * ) Notice: Subject to any disclaimer, the term of this patent is extended or adjusted under 35 U.S.C. 154(b) by 670 days.

(21) Appl. No.: 12/561,887

(22) Filed: Sep. 17, 2009

(65) Prior Publication Data

US 2011/0062995 A1 Mar. 17, 2011

(51) Int. Cl.
*H03K 5/153* (2006.01)
*H03K 19/00* (2006.01)

(52) U.S. Cl.
CPC ........ *H03K 19/0013* (2013.01); *H03K 19/0027* (2013.01)

(58) Field of Classification Search
CPC ....... H03K 17/223; H03K 5/2481; G06F 1/28
See application file for complete search history.

(56) References Cited

U.S. PATENT DOCUMENTS

| | | | |
|---|---|---|---|
| 5,804,996 A * | 9/1998 | Verhaeghe et al. | 327/77 |
| 5,808,492 A * | 9/1998 | Chow | 327/108 |
| 6,867,659 B2 * | 3/2005 | Kolsrud | 333/20 |
| 7,049,868 B2 * | 5/2006 | Lutkemeyer | 327/161 |
| 7,176,753 B2 * | 2/2007 | Noda et al. | 327/543 |
| 2007/0180185 A1 * | 8/2007 | Hein et al. | 711/100 |

* cited by examiner

*Primary Examiner* — Sibin Chen

(74) *Attorney, Agent, or Firm* — Sterne, Kessler, Goldstein & Fox P.L.L.C.

(57) ABSTRACT

Embodiments of the present invention relate generally to detector circuits. Embodiments provide a low-power, accurate reference-free threshold detector. In particular, embodiments reduce leakage current at low input levels and prevent shoot through current for higher than nominal low input levels. Further, embodiments require no bandgap or accurate reference, and as a result eliminate the need for a constantly ON bandgap or accurate reference circuit. As such, embodiments have significantly reduced power consumption compared to conventional circuits. In addition, embodiments detect correctly low and high input levels that are separated narrowly and that may have wide ranges. Embodiments can be extended to any particular design choice of low and high input levels and corresponding output levels.

21 Claims, 9 Drawing Sheets

200

LOW POWER, ACCURATE REFERENCE-FREE THRESHOLD DETECTOR

BACKGROUND

1. Field of the Invention

The present invention relates generally to detector circuits.

2. Background Art

Conventionally, threshold detectors are made using inverter circuits, degenerated common-source input circuits, or comparator circuits. However, inverter and degenerated common-source input circuits perform poorly when the low and high input levels are narrowly separated. Comparator circuits perform well but require a reference from a bandgap or external source such as a Zener diode, for example.

Accordingly, there is a need for improved low cost and low power threshold detectors.

BRIEF SUMMARY

Embodiments of the present invention relate generally to detector circuits.

Embodiments provide a low-power, accurate reference-free threshold detector. In particular, embodiments reduce leakage current at low input levels and prevent shoot through current for higher than nominal low input levels. Further, embodiments require no bandgap reference or other accurate reference (be it on chip or off chip), and as a result eliminate the need for a constantly ON bandgap or accurate reference circuit. As such, embodiments have significantly reduced system cost and power consumption compared to conventional circuits. In addition, embodiments detect correctly low and high input levels that are separated narrowly and that may have wide ranges. Embodiments can be extended to any particular design choice of low and high input levels and corresponding output levels.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. Generally, the drawing in which an element first appears is typically indicated by the leftmost digit(s) in the corresponding reference number.

DETAILED DESCRIPTION OF EMBODIMENTS

Digital input pins are used frequently in electronic circuits as wake up or control pins, and are therefore critical for proper operation of electronic circuits. Generally, as a first stage, a digital input pin includes a threshold detector circuit, which determines whether a received input represents a logic low or a logic high.

To reduce false detections, it is desirable that the low and high input levels that the threshold detector receives are well separated from one another but also narrow in range. For example, typically, low input levels are designed to be no more than a few hundred milliVolts above ground voltage, and high input levels are designed to be no lower than 10% below the supply voltage (e.g., 3.3V).

Figure 4:
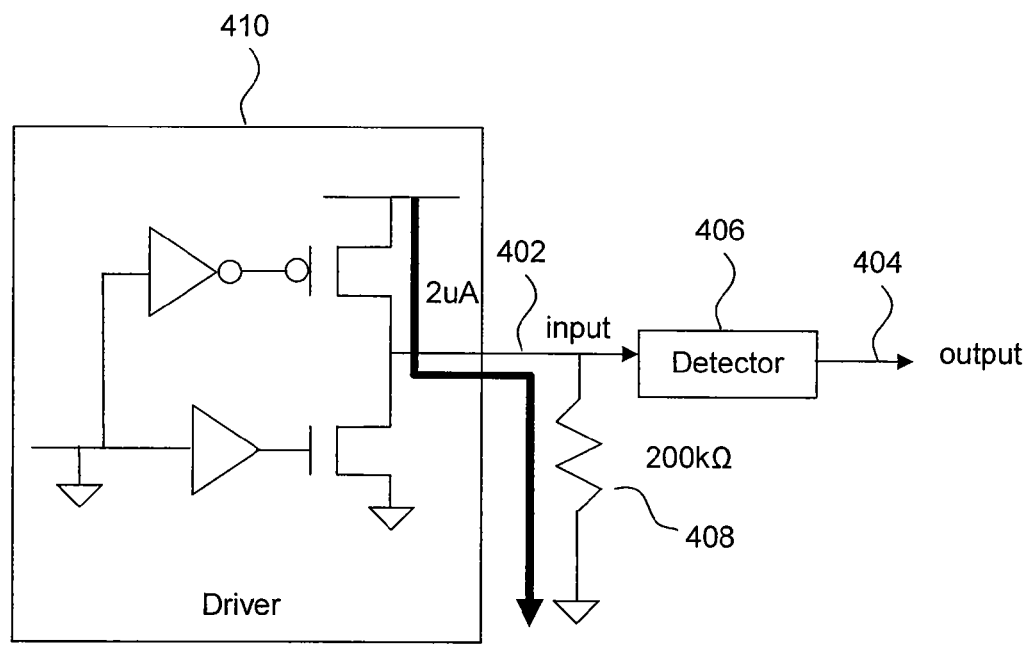
FIG. 4 illustrates an example detector having a driver circuit coupled to its input.

In certain applications, however, the low and high input levels may be closer to each other and may have wider ranges than desired. For example, FIG. 4 shows a circuit 400, in which a threshold detector 406 is being driven by a driver circuit 410. Because of driver circuit 410 and pull-down resistor 408, input signal 402 has a narrower range, and as a result the low and high input levels have a smaller separation. Indeed, with pull-down resistor 408 coupled at the input of detector 406, leakage current from driver 410 causes the low input levels to be higher than nominal and even closer to the high input levels. For example, in circuit 400, the leakage current from driver 410 may cause input 402 to be approximately 0.4 V higher than nominal (e.g., 0 V) (in some instances, process variations may cause input 402 to be even higher and as high as the mid-rail voltage). Accordingly, threshold detector 406 needs to be able to handle (with minimum false detections) low and high input levels that are narrowly separated but also that may vary widely in range.

Conventionally, threshold detectors are made using inverter circuits, degenerated common-source input circuits, or comparator circuits. However, inverter circuits and degenerated common-source input circuits perform poorly when the low and high input levels are narrowly separated, as described above, for example. Comparator circuits, on the other hand, can handle narrowly separated input levels but require a reference from a bandgap or external source such as a Zener diode, which is expensive to implement. This is illustrated below with reference to FIGS. 1, 2, and 3.

Figure 1:
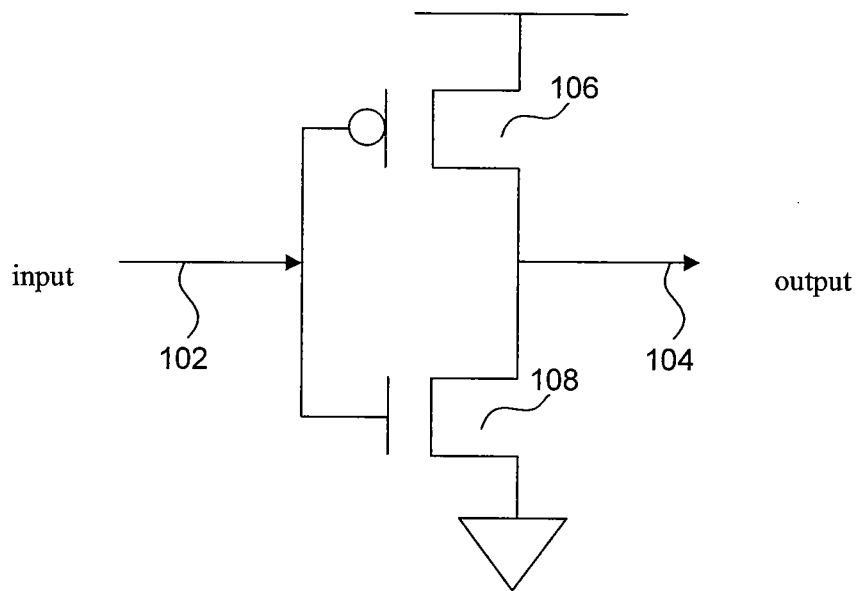
FIG. 1 illustrates an example inverter circuit.

FIG. 1 illustrates an example inverter circuit 100. As shown in FIG. 1, example inverter circuit 100 includes a PMOS transistor 106 and a NMOS transistor 108. PMOS transistor 106 and NMOS transistor 108 have a common gate terminal and a common drain terminal. The source terminal of PMOS transistor 106 is coupled to a supply voltage, and the source terminal of NMOS transistor 108 is coupled to ground. An input signal 102 is provided at the common gate terminal of PMOS transistor 106 and NMOS transistor 108, and an output signal 104 is generated at the common drain terminal of PMOS transistor 106 and NMOS transistor 108.

Generally, inverter circuit 100 operates reasonably well as a threshold detector as long as the low and high input levels are separated sufficiently and the range of each is not larger than the threshold voltage of PMOS transistor 106 and/or NMOS transistor 108. In particular, when input signal 102 is within the low input levels, PMOS transistor 106 will be ON and NMOS transistor 108 will be OFF, resulting in output signal 104 being a logic high. Conversely, when input signal 102 is within the high input levels, PMOS transistor 106 will be OFF and NMOS transistor 108 will be ON, resulting in output signal 104 being a logic low.

However, when the range of either the low or the high input levels is greater than the threshold voltage of PMOS transistor 106 and/or NMOS transistor 108, inverter circuit 100 will not operate properly and may also result in false detection. For example, if PMOS transistor 106 and NMOS transistor 108 have a threshold voltage of 0.3 V, low input levels that range from 0 to 0.4 V, for example, would cause NMOS transistor 108 to turn ON (when the input is greater than 0.3 V) when NMOS transistor 108 should be OFF for the entire time that low input levels are received. Note that in such a case both PMOS transistor 106 and NMOS transistor 108 would be ON at the same time, resulting in an ambiguous value at output 104. In addition, undesirable shoot through current will flow from the power supply to ground, increasing the power consumption of the detector circuit.

It is noted that in low-power applications the input signal voltage can be very low. As such, for an inverter circuit to operate as a threshold detector in such applications, the PMOS and NMOS transistors also need to have low threshold voltages (i.e., with the input signal being low, the threshold voltages should be low to allow the transistors to turn ON). This, however, further accentuates the problem described above because even narrower low/high input levels will be needed.

Figure 2:
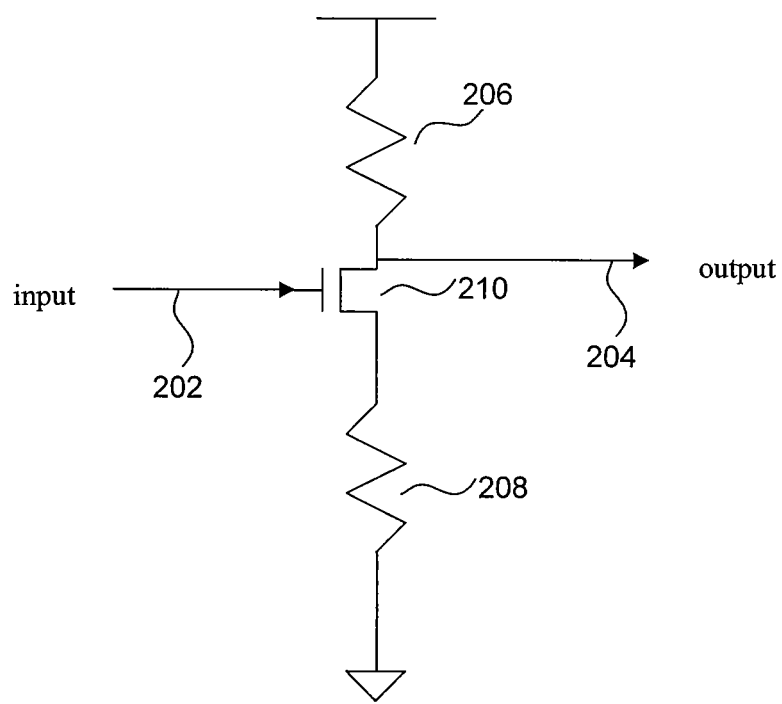
FIG. 2 illustrates an example degenerated common-source input circuit.

FIG. 2 illustrates an example degenerated common-source input circuit 200, which may be used as a threshold circuit. As shown in FIG. 2, example circuit 200 includes a pull-up resistor 206, a NMOS transistor 210, and a pull-down (degeneration) resistor 208. Pull-up resistor 206 is coupled between a supply voltage and the drain terminal of NMOS transistor 210. Degeneration resistor 208 is coupled between the source terminal of NMOS transistor 210 and ground. An input signal 202 is provided at the gate terminal of NMOS transistor 210, and an output signal 204 is generated at the drain terminal of NMOS transistor 210.

For low input signal levels (i.e., input levels that do not cause NMOS transistor 210 to turn ON), output 204 reflects the supply voltage level (indicating a logic high at output 204 or a logic low at input 202). Conversely, high input signal levels (i.e., input levels that cause NMOS transistor 210 to turn ON) cause output 204 to pull down to ground (indicating a logic low at output 204 or a logic high at input 202). Thus, degenerated common-source input circuit 200 operates similar to an inverter, inverting the input logic at the output.

It is noted that degeneration resistor 208 causes the source terminal of NMOS transistor 210 to sit at a higher voltage. As a result, example circuit 200 can better handle a higher than nominal low input level than example circuit 100. For example, output 204 of example circuit 200 is less likely to pull down to ground when input signal 202 is at 0.48 V (a low input level) due to degeneration resistor 208. However, because process variations may cause degeneration resistor 208 to be too large, example circuit 200 suffers from at least one drawback, namely that output 204 may not pull down to ground (as required) when the input is at 1.08 V (a high input level). Thus, a high input level will be detected incorrectly as a low input level.

Figure 3:
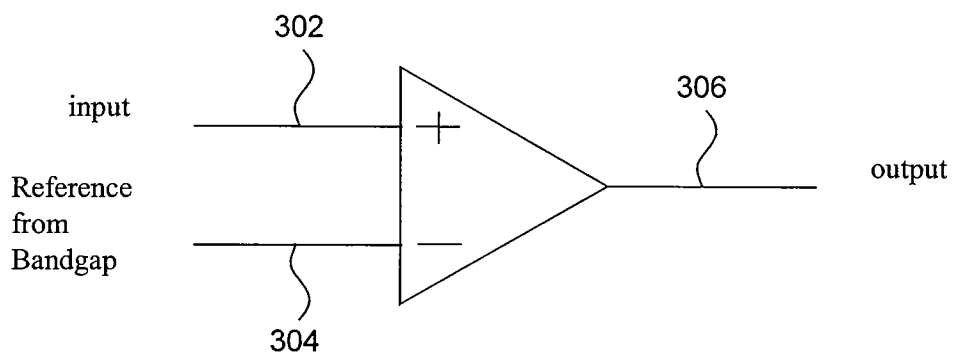
FIG. 3 illustrates an example comparator circuit.

FIG. 3 illustrates an example comparator circuit 300, which is used commonly as a threshold detector. As shown in FIG. 3, example comparator circuit 300 includes an operational amplifier in an open loop configuration (i.e., no negative feedback). The operational amplifier receives an input signal 302 at its non-inverting terminal and a reference signal 304 at its inverting terminal, and generates an output signal 306. Typically, reference signal 304 is derived from a bandgap reference on-chip or off-chip. An off-chip (external) reference signal requires an extra pin, and thus extra cost is incurred. Further, in terms of the overall system, the external reference incurs a power penalty when it is turned ON. Another possible source of reference signal can be an external Zener diode. However, the Zener diode also requires additional cost, additional footprint, and typically consumes more power than a bandgap.

When input signal 302 exceeds reference signal 304, the high gain of the operational amplifier causes output signal 306 to be positive (indicating a logic high). Conversely, when input signal 302 is below reference signal 304, output signal 306 will be negative (indicating a logic low).

Despite being accurate generally, comparator circuit 300 has some drawbacks. For example, comparator circuit 300 depends on having a bandgap reference, which requires having a constantly ON bandgap reference circuit. This, in addition to using an operational amplifier, makes comparator circuit 300 high in power consumption and unsuitable for low-power applications.

Embodiments of the present invention, as will be further described below, provide a low-power, accurate reference-free threshold detector. In particular, embodiments reduce leakage current at low input levels and prevent shoot through current for higher than nominal low input levels. Further, embodiments require no bandgap or other accurate reference (be it on chip or off chip), and as a result eliminate the need for a constantly ON bandgap or accurate reference circuit. As such, embodiments have significantly reduced power consumption compared to conventional circuits. In addition, embodiments can detect correctly low and high input levels that are separated narrowly and that may have wide ranges. It is noted that by accurate reference or accurate reference generator herein it is meant all possible types of accurate reference circuits that exist today or may be conceived in the future, including standard bandgaps and Zener diodes, for example, regardless of the accuracy of the reference circuit.

Figure 5:
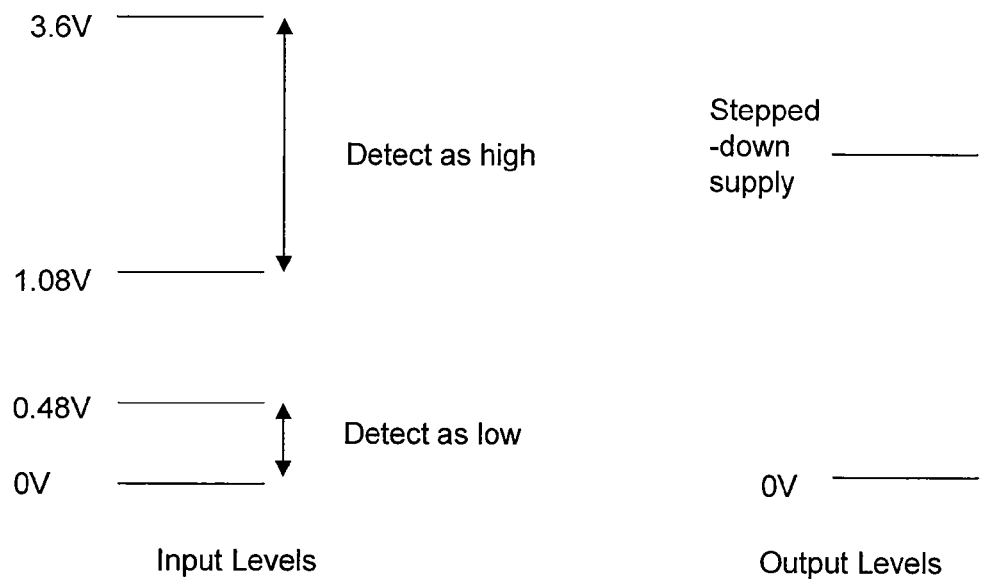
FIG. 5 illustrates example input level ranges and corresponding output levels according to an embodiment of the present invention.

In the following, an example embodiment will be described. The example embodiment will be described with reference to specific design values shown in FIG. 5. In particular, as shown in FIG. 5, the example embodiment is designed to detect input levels between 1.08 V and 3.6 V as a logic high and to output a stepped-down supply voltage for high input levels. In addition, the example embodiment is designed to detect input levels between 0 V and 0.48 V as a logic low and to output 0 V for low input levels.

As would be understood by a person skilled in the art based on the teachings herein, embodiments are not limited to the example embodiment described herein, but extend to any particular design choice of low and high input levels and corresponding output levels.

Figure 6:
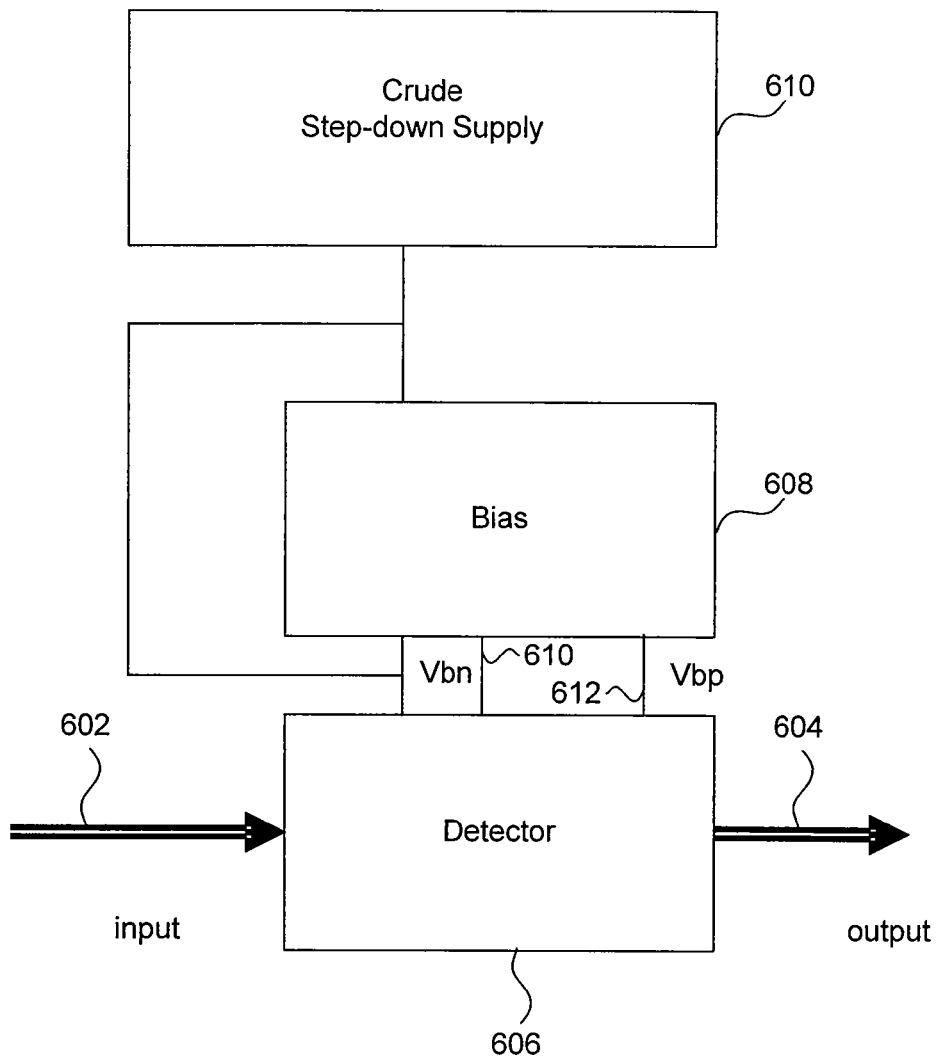
FIG. 6 illustrates a detector system according to an embodiment of the present invention.

FIG. 6 illustrates a detector system 600 according to an embodiment of the present invention. As shown in FIG. 6, detector system 600 includes a detector circuit 606, a bias circuit 608, and a step-down supply circuit 610.

Detector circuit 606 receives an input signal 602 and outputs an output signal 604. As described above, input signal 602 varies between low and high input levels that represent logic low and logic high, respectively, for example. In addition, detector circuit 608 receives bias signals Vbn 610 and Vbp 612 from bias circuit 608. Bias signals Vbn 610 and Vbp 612 are further described below with reference to FIGS. 8 and 9.

Step-down supply circuit 610 powers up detector circuit 606 and bias circuit 608. In an embodiment, step-down supply circuit 610 generates a stepped-down output voltage from a received input voltage. For example, step-down supply 610 may receive an input ranging from 2.3 V to 4.2 V and may output a stepped-down output between 1.8 V and 3.6 V. In an embodiment, step-down supply circuit 610 is a crude supply (i.e., not accurate) which consumes low power and is inexpensive.

Example embodiments of detector circuit 606, bias circuit 608, and step-down supply circuit 610 are provided below. As would be understood by a person skilled in the art based on the teachings herein, embodiments are not limited to the examples provided herein, but extend to any variations or improvements that would be apparent to a person of skill in the art.

Figure 7:
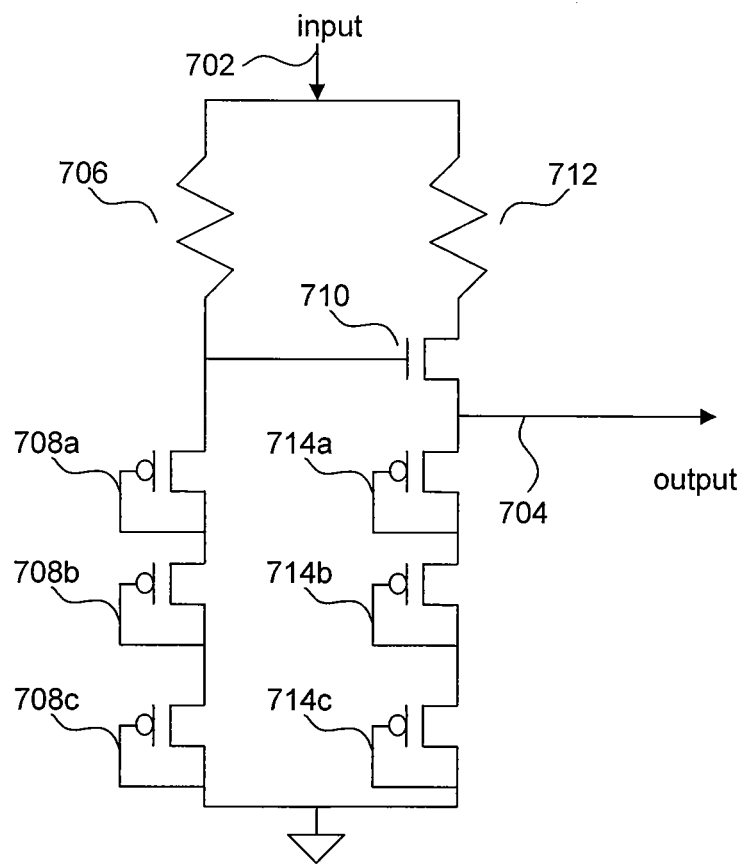
FIG. 7 illustrates an example step-down supply according to an embodiment of the present invention.

FIG. 7 illustrates an example step-down supply circuit 700 according to an embodiment of the present invention. As shown in FIG. 7, step-down supply circuit 700 includes a first branch, including a resistor 706 and a plurality of diode-connected PMOS transistors 708, and a second branch, including a resistor 712, a NMOS transistor 710, and a plurality of diode-connected PMOS transistors 714.

Step-down supply circuit 700 is powered by an input supply voltage 702. In an embodiment, input supply voltage 702 ranges between 2.3 V and 4.2 V, which is the typical range of a commonly used Lithium-ion battery.

In an embodiment, PMOS transistors 708 operate like forward biased diodes. Accordingly, PMOS transistors 708 cause the gate terminal of NMOS transistor 710 to be set at a fixed voltage. For example, in the embodiment of FIG. 7, PMOS transistors 708 cause the gate terminal of NMOS transistor 710 to be set at approximately 2.1 V (3 times 0.7V).

As a result, when NMOS 710 is in active state, the source terminal of NMOS 710 (i.e., output 704 of step-down supply circuit 700) is also set at a fixed voltage, equal to the gate terminal voltage minus Vgs(th), where Vgs(th) is the gate-to-source threshold voltage of NMOS 710. Therefore, output 704 of step-down supply circuit 700 can be set at a desired voltage by selecting NMOS transistor 710 to have an appropriate threshold voltage. For example, output 704 can be set at 1.8 V by selecting NMOS transistor 710 to have a threshold voltage of 0.3 V. In an embodiment, step-down supply circuit 700 outputs a stepped-down voltage that ranges from 1.8 V to 3.6 V which depends on the variation of input supply voltage 702 and the threshold voltages of the transistors over process corners.

It is noted that resistor 706 and resistor 712 serve to limit the currents that flow in the first and second branches of step-down supply circuit 700, and thus limit the power consumption of step-down supply circuit 700. PMOS transistors 714, on the other hand, ensure that enough current flows through NMOS 710 to operate in active state.

In an embodiment, to ensure proper operation of the detector circuit, supply circuit 700 must ensure that its output voltage does not drop below a minimum output voltage. The minimum output voltage depends on the minimum input voltage required to be detected as a high (e.g., 1.08 V in the example embodiment described above). In an embodiment, the minimum output voltage is at least one threshold voltage higher than the minimum input voltage required to be detected as high. For example, for the input detection ranges shown in FIG. 5, the minimum output voltage is approximately equal to 1.6 V.

Figure 8:
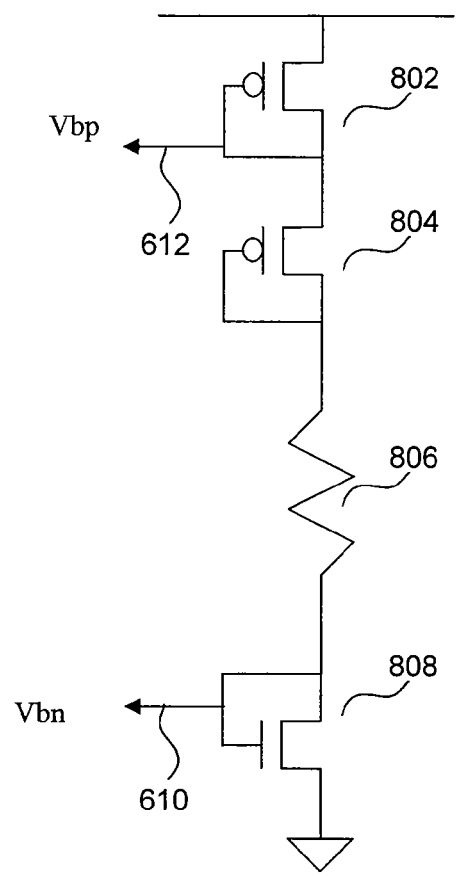
FIG. 8 illustrates an example bias circuit according to an embodiment of the present invention.

FIG. 8 illustrates an example bias circuit 800 according to an embodiment of the present invention. As would be understood by a person skilled in the art based on the teachings herein, various other circuits may be used to implement a bias circuit such as example bias circuit 800. However, example bias circuit 800 provides a simple, small, and power-efficient architecture.

As shown in FIG. 8, example bias circuit 800 includes a plurality of diode-connected transistors 802, 804, and 808 and a resistor 806. In an embodiment, transistors 802 and 804 are PMOS transistors, and transistor 808 is an NMOS transistor. PMOS transistor 802 has its source terminal coupled to a supply voltage and provides bias signal Vbp 612 at its drain/gate terminal. NMOS transistor 808 has its source terminal coupled to ground and provides bias signal Vbn 610.

Bias circuit 800 provides constant bias voltages to the detector circuit of the detector system. In particular, because PMOS transistor 802 is a diode-connected transistor, bias signal Vbp 612 is at Vsg(th) below the supply voltage, where Vsg(th) is the source-to-gate threshold voltage of PMOS transistor 802. Similarly, because NMOS transistor 808 is a diode-connected transistor, bias signal Vbn 610 is at Vgs(th) above ground, where Vgs(th) is the gate-to-source threshold voltage of NMOS transistor 808. Thus, by selecting appropriate values for Vsg(th) of PMOS transistor 802 and Vgs(th) of NMOS transistor 808 as well as resistor 806, bias signals Vbp 612 and Vbn 610 can be set at respective desired values.

Accordingly, bias circuit 800 provides a simple and power-efficient way for eliminating the bandgap reference circuit, commonly used in conventional systems.

Figure 9:
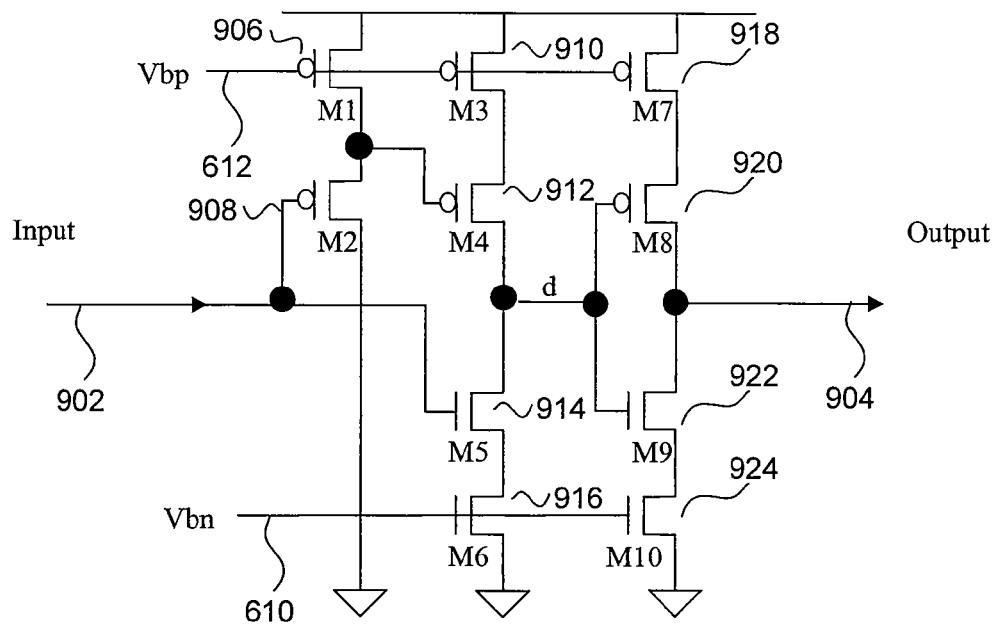
FIG. 9 illustrates an example threshold detector circuit according to an embodiment of the present invention.

FIG. 9 illustrates a threshold detector circuit 900 according to an embodiment of the present invention.

As shown in FIG. 9, detector circuit 900 includes a step-up input stage that includes transistors M1 906 and M2 908; an intermediate stage that includes an upper branch, including transistors M3 910 and M4 912, and a lower branch, including transistors M5 914 and M6 916; and an output stage that includes an upper branch, including transistors M7 918 and M8 920, and a lower branch, including transistors M9 922 and M10 924. In an embodiment, as shown in FIG. 9, transistors M1 906, M2 908, M3 910, M4 912, M7 918, and M8 920 are PMOS transistors, and transistors M5 914, M6 916, M9 922, and M10 924 are NMOS transistors.

Transistors M1 906, M3 910, and M7 918 receive bias signal Vbp 610 from bias circuit 800 (described above) at their respective gate terminals. In addition, transistors M1 906, M3 910, and M7 918 are coupled at their respective source terminals to a supply voltage. In an embodiment, the supply voltage is as low as 1.6 V. Similarly, transistors M6 916 and M10 924 receive bias signal Vbn 610 from bias circuit 800 at their respective gate terminals. In addition, transistors M6 916 and M10 924 have their respective source terminals coupled to ground.

An input signal 902 is received at the respective gate terminals of transistors M2 908 and M5 914, and an output signal 904 is generated at a common-drain terminal of transistors M8 920 and M9 922.

As noted above, transistors M1 906 and M2 908 provide a step-up input stage. In particular, because the source terminal of transistor M2 908 is coupled to the gate terminal of transistor M4 912, M1 906 and M2 908 provide a stepped up input to the gate terminal of M4 912 (e.g., 0.5 V above input 902). As a result, transistor M4 912 receives a stepped input compared to transistor M5 914. Operation of detector circuit 900 is as described below.

For low input levels (e.g., 0 V-0.48 V) of input 902, the gate terminal of M4 912 can be as high as 0.98 V (for a threshold voltage of 0.5 V of M2 908). Accordingly, the source terminal of M4 912 can be as high as 1.48 V. With the supply voltage at 1.6, the drain to source voltage of transistor M3 910 is just high enough to turn transistor M3 910 on. Accordingly, node d (shown in FIG. 9 as the common terminal node between transistors M4 912 and M5 914) is coupled to the supply voltage through the drain and source of M4 912 and M3 910 and can be as high as 1.4 V. Note that for low input levels, transistors M5 914 and M6 916 will be off. With node d at a high voltage, transistor M8 920 turns off and transistor M9 922 turns on very hard, pulling output 904 to a low voltage above ground. In an embodiment, transistor M10 924 acts to limit the current through M9 922 and M10 924 so that output 904 is almost at 0 V. Thus, for low input levels of input 902, output 904 will be low.

For high input levels (e.g., 1.08 V-3.6 V) of input 902, the gate terminal of M4 912 is at least at 1.58 V. With the supply voltage at 1.6 V, M3 910 and M4 912 will be off. On the other hand, the gate terminal of M5 912 is at least at 1.08 V causing transistors M5 914 and M6 916 to turn on very hard and pulling node d low. With node d at a low voltage, transistors M7 918 and M8 920 turn on coupling output 904 to the supply voltage, and transistors M9 922 and M10 924 turn off. Thus, for high input levels of input 902, output 904 will be high.

It is noted that from a functionality point of view transistors M1 906 and M2 908 ensure that transistors M3 910 and M4 912 turn off very hard when input 902 is toggled to high. Transistors M3 910, M6 916, M7 918, and M10 924, on the other hand, play a current limiting role, including limiting shoot through current when the voltage at node d is near the mid-rail voltage. Transistor M6 916 has the additional role of bringing up the input threshold voltage to about 0.48V. Transistors M7 918, M8 920, M9 922, and M10 924 collectively act as an amplifier to amplify the signal at node d and make the output 904 closer to the supply rail or ground.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present invention should not be limited by any of the above-described exemplary embodiments, but should be defined only in accordance with the following claims and their equivalents.

What is claimed is:

1. A threshold detector system receiving an input signal having values represented by only a low range or a high range, the low range and the high range being non-overlapping, the low range comprising values between a first threshold and a second threshold, and the high range comprising values between a third threshold and a fourth threshold, the threshold detector system comprising:
    a detector circuit that receives the input signal and that generates a logic output, the logic output being a logic low value when the input signal values are in the low range and a logic high value when the input signal values are in the high range;
    a bias circuit, coupled to the detector circuit, that generates first and second bias signals for biasing the detector circuit; and
    a supply circuit that provides a supply voltage to the detector circuit and the bias circuit,
    wherein the first bias signal is fixed at a first desired value below the supply voltage, and the second bias signal is fixed at a second desired value above a minimum voltage.

2. The threshold detector system of claim 1, wherein the detector circuit comprises;
    a step-up input stage that receives the input signal and that outputs a stepped-up input signal;
    an intermediate stage having an upper branch and a lower branch, wherein the lower branch of the intermediate stage receives the input signal and the upper branch of the intermediate stage receives the stepped-up input signal, and wherein the intermediate stage generates an intermediate output; and
    an output stage having an upper branch and a lower branch, wherein the upper branch and the lower branch of the output stage receive the intermediate output at a common input node, and wherein the output stage generates the logic output of the detector circuit.

3. The threshold detector system of claim 2, wherein the upper branch of the intermediate stage and the upper branch of the output stage are coupled to the supply voltage provided by the supply circuit, and wherein the lower branch of the intermediate stage and the lower branch of the output stage are coupled to ground.

4. The threshold detector system of claim 3, wherein the upper branch and the lower branch of the intermediate stage each includes a plurality of series-coupled transistors.

5. The threshold detector system of claim 4, wherein when the input signal is in the low range, the step-up input stage causes the upper branch transistors to be on and the lower branch transistors to be off, thereby causing the intermediate output to be at a high voltage.

6. The threshold detector system of claim 4, wherein when the input signal is in the high range, the step-up input stage causes the upper branch transistors to be off and the lower branch transistors to be on, thereby causing the intermediate output to be at a low voltage.

7. The threshold detector system of claim 4, wherein the upper branch transistors are PMOS transistors, and the lower branch transistors are NMOS transistors.

8. The threshold detector system of claim 3, wherein the upper branch and the lower branch of the output stage each includes a plurality of series-coupled transistors.

9. The threshold detector system of claim 8, wherein when the input signal is in the low range, the upper branch transistors are off and the lower branch transistors are on, thereby causing the logic output of the detector circuit to be at the logic low value.

10. The threshold detector system of claim 8, wherein when the input signal is in the high range, the upper branch transistors are on and the lower branch transistors are off, thereby causing the logic output of the detector circuit to be at the logic high value.

11. The threshold detector system of claim 8, wherein the upper branch transistors are PMOS transistors, and the lower branch transistors are NMOS transistors.

12. The threshold detector system of claim 8, wherein the upper branch of the output stage includes first and second transistors, and wherein the first transistor receives the intermediate output at its gate terminal and the second transistor receives the first bias signal from the bias circuit at its gate terminal.

13. The threshold detector system of claim 12, wherein the lower branch of the output stage includes third and fourth transistors, and wherein the third transistor receives the intermediate output at its gate terminal and the fourth transistor receives the second bias signal from the bias circuit at its gate terminal.

14. The threshold detector system of claim 13, wherein the second transistor and the fourth transistor represent a shoot through current limiting stage of the output stage.

15. The threshold detector system of claim 3, wherein the upper branch of the intermediate stage includes first and second transistors, and wherein the first transistor receives the stepped-up input signal at its gate terminal and the second transistor receives the first bias signal from the bias circuit at its gate terminal.

16. The threshold detector system of claim 15, wherein the lower branch of the intermediate stage includes third and fourth transistors, and wherein the third transistor receives the input signal at its gate terminal and the fourth transistor receives the second bias signal from the bias circuit at its gate terminal.

17. The threshold detector system of claim 16, wherein the second transistor and the fourth transistor represent a current limiting stage of the intermediate stage.

18. The threshold detector system of claim 1, wherein the first threshold is equal to 0 V, the second threshold is equal to 0.48 V, the third threshold is equal to 1.08 V, and the fourth threshold is equal to 3.6 V.

19. The threshold detector system of claim 1, wherein the threshold detector system is accurate reference generator-free.

20. The threshold detector system of claim 1, wherein the threshold detector system is bandgap reference-free and Zener diode-free.

21. The threshold detector system of claim 1, wherein the supply voltage generated by the supply circuit is a stepped-down minimum voltage to ensure proper operation of the detector circuit.

\* \* \* \* \*